(12) United States Patent
Kato

(10) Patent No.: US 7,564,493 B2
(45) Date of Patent: Jul. 21, 2009

(54) SOLID-STATE IMAGING APPARATUS AND METHOD FOR DRIVING SOLID-STATE IMAGING DEVICE

(75) Inventor: Yoshiaki Kato, Shiga (JP)

(73) Assignee: Panasonic Corporation, Osaka (JP)

( * ) Notice: Subject to any disclaimer, the term of this patent is extended or adjusted under 35 U.S.C. 154(b) by 347 days.

(21) Appl. No.: 11/693,300

(22) Filed: Mar. 29, 2007

(65) Prior Publication Data

US 2007/0236592 A1 Oct. 11, 2007

(30) Foreign Application Priority Data

Apr. 5, 2006 (JP) ............................. 2006-104472

(51) Int. Cl.
*H04N 3/14* (2006.01)
*H04N 5/335* (2006.01)
(52) U.S. Cl. ...................... 348/294; 348/311; 348/322; 348/323
(58) Field of Classification Search ................. 348/311, 348/272, 322–323
See application file for complete search history.

(56) References Cited

U.S. PATENT DOCUMENTS

| 6,519,000 | B1 | 2/2003 | Udagawa |
| 7,256,831 | B2 * | 8/2007 | Iizuka ........................ 348/315 |
| 7,403,226 | B2 * | 7/2008 | Nakano et al. .............. 348/294 |
| 7,479,988 | B2 * | 1/2009 | Sase et al. ................ 348/220.1 |

| 2002/0135689 | A1 * | 9/2002 | Uya ........................... 348/280 |
| 2004/0150733 | A1 | 8/2004 | Nagayoshi et al. |

FOREIGN PATENT DOCUMENTS

| JP | 9-18792 | 1/1997 |
| JP | 2004-180284 | 6/2004 |

\* cited by examiner

*Primary Examiner*—Jason Chan
*Assistant Examiner*—Pritham Prabhakher
(74) *Attorney, Agent, or Firm*—Hamre, Schumann, Mueller & Larson, P.C.

(57) ABSTRACT

Vertical transfer portions for transferring signal charges from photoelectric conversion portions in a vertical direction and a horizontal transfer portion for transferring them in a horizontal direction are provided, and each of a plurality of vertical transfer stages constituting the vertical transfer portion is provided with a plurality of phases of transfer electrodes. The transfer electrodes at a vertical last stage include independent transfer electrodes (V3R, V5R) for at least two phases, that are independent of the other vertical transfer stages, have identical configurations repeated in a unit of n columns, and are in common among corresponding columns in a plurality of the units of n columns and independent of the independent transfer electrodes belonging to the other columns in the unit of n columns. A signal transfer stage from which the signal charge is read out and a dummy transfer stage from which the signal charge is not read out are formed alternately, the signal charge at the signal transfer stage and a dummy signal at the following dummy transfer stage are mixed together at the vertical last stage and then transferred to the horizontal transfer portion. In the case where a dummy transfer stage is formed for transfer, it is possible to suppress transfer degradation and mix a dummy signal with a signal charge.

7 Claims, 7 Drawing Sheets

SOLID-STATE IMAGING APPARATUS AND METHOD FOR DRIVING SOLID-STATE IMAGING DEVICE

BACKGROUND OF THE INVENTION

1. Field of the Invention

The present invention relates to a solid-state imaging apparatus and a method for driving a solid-state imaging device, in which light received by a plurality of two-dimensionally arranged photoelectric conversion portions is converted into electric signals and outputted as image signals. In particular, the present invention relates to a solid-state imaging apparatus and a method for driving a solid-state imaging device, in which the image signals can be outputted at a high frame rate.

2. Description of Related Art

Known solid-state imaging devices, which convert light received by individual pixels into electric signals and output them as image signals, include those using CCDs (charge-coupled devices). Also, digital still cameras utilizing such solid-state imaging devices have been widespread. In recent years, with an increase in the density of pixels in the solid-state imaging devices, the digital still cameras achieving a higher resolution than silver halide photographs have been achieved. FIG. 7 shows the configuration of a general single-plate color solid-state imaging device for a conventional digital still camera. This solid-state imaging device 101 includes photoelectric conversion portions 102 having color filters in a Bayer arrangement, readout portions 103 for reading out signal charges respectively from the photoelectric conversion portions 102, vertical transfer portions 104 that are arranged so as to correspond to respective columns of the photoelectric conversion portions 102 for transferring the read out signal charges in a vertical direction, a horizontal transfer portion 105 for transferring the signal charges received from the vertical transfer portions 104 in a horizontal direction, and an output portion 106 for amplifying and outputting the signal charges from the horizontal transfer portion 105.

In many cases, the digital still cameras have a function of recording moving pictures as well as still pictures. Most of the digital still cameras now have more than 4,000,000 pixels, for example, for recording still pictures, whereas the pixels generally are thinned out so as to secure the frame frequency necessary for recording moving pictures (for example, at least 30 frames/second). In a generally adopted method for thinning out (reducing the number of) the pixels in the vertical direction, the signal charges in not all but only part of the photoelectric conversion portions in each column, for example the signal charge of one of the three adjacent photoelectric conversion portions, is selected and read out to the vertical transfer portion.

Another method for reducing the number of the pixels in the vertical direction is described in JP 9(1997)-18792 A. In this method, the signal charges at adjacent plural vertical transfer stages among plural vertical transfer stages constituting the vertical transfer portion are transferred successively to the horizontal transfer portion. In this way, the signal charges at the adjacent plural vertical transfer stages are mixed together in the horizontal transfer portion so as to reduce the number of the pixels in the vertical direction, thereby making it possible to achieve a still higher frame frequency.

Further, JP 2004-180284 A describes a solid-state imaging device capable of reducing the number of (thinning out) pixels in the horizontal direction. In this solid-state imaging device, vertical last stages of the individual columns of the vertical transfer portions have transfer electrodes with identical configurations repeated every (2n+1) columns (for example, three columns) in which at least two independent transfer electrodes that are independent of the transfer electrodes in the other columns in the (2n+1) columns for controlling a transfer operation from the vertical last stage to the horizontal transfer portion by each column. For example, in the case where two colors of pixels alternate in a single row as in the Bayer arrangement, the operation of transferring selectively the signal charges in every other pixels with the same color from the vertical last stages to the horizontal transfer portion and mixing them together is repeated (2n+1) times, thereby reducing the number of the pixels in the horizontal direction to 1/(2n+1).

As described above, when the moving pictures are recorded using a solid-state imaging device with a large total number of pixels, the number of pixels is reduced in such a manner as not to lower the frame frequency. In this case, for suppressing image quality degradation, it is desired to reduce the number of pixels in both of the horizontal and vertical directions so that the resolutions in the horizontal and vertical directions are balanced. However, it would not be possible to combine the configuration described in JP 9(1997)-18792 A capable of reducing the number of pixels in the vertical direction with that described in JP 2004-180284 A capable of reducing the number of pixels in the horizontal direction. In other words, it would be impossible to perform the operation in which the signal charges at plural vertical transfer stages are transferred successively to the horizontal transfer portion as in the configuration described in JP 9(1997)-18792 A simultaneously with the operation in which the signal charges in every other pixels with the same color in the horizontal direction present in the vertical last stages are mixed together in the horizontal transfer portion as in the configuration described in JP 2004-180284 A. Accordingly, in the case of reducing the number of pixels in the vertical direction simultaneously with reducing the number of pixels in the horizontal direction with the configuration described in JP 2004-180284 A, dummy vertical transfer stages from which the signal charges in the photoelectric conversion portions are not read out at all (dummy transfer stages) are formed partially so that the dummy transfer to the horizontal transfer portion is performed, thereby reducing the number of pixels in the vertical direction.

However, in this case, there is a problem that a smear occurring when capturing an image of a radiant with too much light quantity has a jagged edge, though a smear naturally has a linear edge. For example, in the case where signal charges from three pixels with the same color, which are every other pixels arranged in the horizontal direction, are mixed together in the configuration of JP 2004-180284 A, pixel signals of the three vertical transfer stages are aligned periodically in the horizontal transfer portion in the order of G1, G2, G3, R1, B2 and R3 (R, G and B respectively indicate red, green and blue, and numerals 1, 2 and 3 indicate the first, second and third vertical transfer stages from the side closer to the horizontal transfer portion). These pixel signals should be rearranged at their original mixture centers of gravity of the respective pixels at the time of displaying an image. However, in the configuration of JP 2004-180284 A, while the charge signals in the horizontal transfer portion are being shifted in the horizontal direction, the charge signals at the vertical last stages are transferred to the horizontal transfer portion and mixed together. Thus, smear charges at the dummy transfer stages are mixed with the signal charges at the vertical transfer stages in the other columns. As a result, in the image rearranged at the original mixture centers of gravity, the smear edge, which is naturally linear in the vertical direction, is displaced by each set of three pixels in the vertical direction and thus appears jagged.

Further, even in the case where no smear occurs, if a transfer leakage from the vertical transfer stage that is transferring a signal charge causes the signal charge to leak into the dummy transfer stage during transfer through the vertical transfer stages, the leaking signal charge sometimes is mixed with the signal charge in another column in the horizontal transfer portion, which may result in poor image quality due to transfer degradation.

SUMMARY OF THE INVENTION

With the foregoing conventional problems in mind, it is an object of the present invention to provide a solid-state imaging apparatus that can suppress image quality deficiencies due to transfer degradation and mix a dummy signal with a signal charge in the case where a dummy transfer stage is formed for transfer.

It is a further object of the present invention to provide a method for driving such a solid-state imaging device.

A solid-state imaging apparatus according to the present invention includes a plurality of photoelectric conversion portions that are arranged two-dimensionally in a matrix form, a readout portion for reading out selectively a signal charge from each of the photoelectric conversion portions, a plurality of vertical transfer portions, provided so as to correspond to respective columns of the photoelectric conversion portions, for transferring the signal charge read out by the readout portion in a vertical direction, a horizontal transfer portion for transferring the signal charge received from the plurality of vertical transfer portions in a horizontal direction, and a control portion for supplying a drive signal to each of transfer electrodes constituting the readout portion, the vertical transfer portions and the horizontal transfer portion and controlling the read out of the signal charge by the readout portion and the transfer of the signal charge. Each of the plurality of vertical transfer portions includes a plurality of vertical transfer stages, each provided with a plurality of phases of the transfer electrodes.

In order to solve the above-mentioned problems, the transfer electrodes at a vertical last stage, which is closest to the horizontal transfer portion among the vertical transfer stages, include independent transfer electrodes for at least two phases, that are independent of the other vertical transfer stages. The independent transfer electrodes have identical configurations repeated in a unit of n (n is an integer equal to or larger than 2) columns and are constituted so as to be in common among corresponding columns in a plurality of the units of n columns and independent of the independent transfer electrodes belonging to the other columns in the unit of n columns. At a time of reading out the signal charge, the readout portion is driven so that a signal transfer stage from which the signal charge is read out and a dummy transfer stage from which the signal charge is not read out are formed alternately in the plurality of vertical transfer stages constituting each column of the vertical transfer portions. The signal charge and a dummy signal at the signal transfer stage and the dummy transfer stage that are arranged alternately are transferred toward the horizontal transfer portion, and the signal charge at the signal transfer stage and the dummy signal at the following dummy transfer stage are mixed together at the vertical last stage. The transfer electrodes are driven so that the mixed signal charges at the vertical last stage are transferred to the horizontal transfer portion. It should be noted that the term "phases" used for the transfer electrodes refers to phases of transfer signals.

A method for driving a solid-state imaging device according to the present invention is a method for driving a solid-state imaging device including a plurality of photoelectric conversion portions that are arranged two-dimensionally in a matrix form, a readout portion for reading out selectively a signal charge from each of the photoelectric conversion portions, a plurality of vertical transfer portions, provided so as to correspond to respective columns of the photoelectric conversion portions, for transferring the signal charge read out by the readout portion in a vertical direction, and a horizontal transfer portion for transferring the signal charge received from the plurality of vertical transfer portions in a horizontal direction. Each of the plurality of vertical transfer portions includes a plurality of vertical transfer stages, each provided with a plurality of phases of transfer electrodes. The transfer electrodes at a vertical last stage, which is closest to the horizontal transfer portion among the vertical transfer stages, include independent transfer electrodes for at least two phases, that are independent of the other vertical transfer stages. The independent transfer electrodes have identical configurations repeated in a unit of n (n is an integer equal to or larger than 2) columns and are constituted so as to be in common among corresponding columns in a plurality of the units of n columns and independent of the independent transfer electrodes belonging to the other columns in the unit of n columns.

In order to solve the above-mentioned problems, the method for driving a solid-state imaging device according to the present invention includes (a) at a time of reading out the signal charge, supplying a control signal to the readout portion so that a signal transfer stage from which the signal charge is read out and a dummy transfer stage from which the signal charge is not read out are formed alternately in each of the vertical transfer stages constituting each column of the vertical transfer portions, (b) transferring the signal charge and a dummy signal at the signal transfer stage and the dummy transfer stage that are arranged alternately toward the horizontal transfer portion, (c) mixing together the signal charge at the signal transfer stage and the dummy signal at the following dummy transfer stage at the vertical last stage, and (d) transferring the mixed signal charges at the vertical last stage to the horizontal transfer portion.

DETAILED DESCRIPTION OF THE INVENTION

Figure 1:
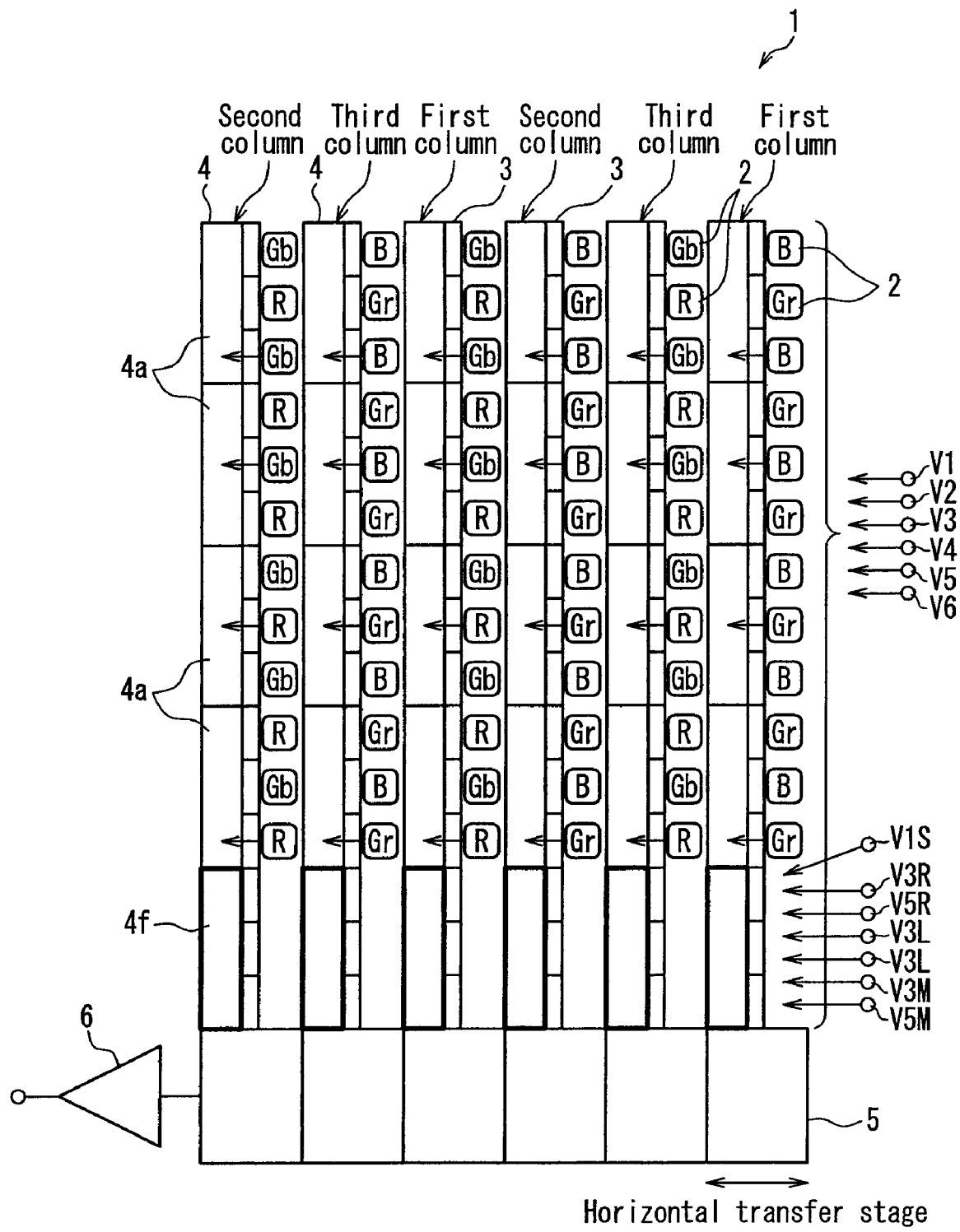
FIG. 1 shows a schematic configuration of a solid-state imaging device according to an embodiment of the present invention.

With the solid-state imaging apparatus or the method for driving a solid-state imaging device according to the present invention, the transfer electrodes at the vertical last stage include at least two phases of independent transfer electrodes that are independent of the other vertical transfer stages, and the independent transfer electrodes have identical configurations repeated in a unit of n columns, and are constituted so as to be in common among each column in the unit of n columns and independent of the independent transfer electrodes belonging to the other columns in the unit of n columns. A signal transfer stage from which the signal charge is read out and a dummy transfer stage from which the signal charge is not read out are formed alternately, and the signal charge at the signal transfer stage and a dummy signal at the following dummy transfer stage are mixed together at the vertical last stage and then transferred to the horizontal transfer portion. By operating the independent transfer electrodes at the vertical last stage appropriately, the signal charge and the dummy signal at the following dummy transfer stage can be mixed together at the vertical last stage and then transferred to the horizontal transfer portion. Thus, it is possible to avoid the mixing of the smear charges or the signal charges leaking due to the transfer leakage with the signal charges of inappropriate pixels.

In the solid-state imaging apparatus according to the present invention with the above-described configuration, it is preferable that the signal charge at the signal transfer stage and the dummy signal at the following dummy transfer stage are mixed together by supplying a control signal to each of the independent transfer electrodes so that a side close to the horizontal transfer portion in all of the unit of n columns of the independent transfer electrodes is made to be in a barrier state against the horizontal transfer portion and a side far from the horizontal transfer portion is made to be in a storage state.

Also, it is preferable that, when the mixed signal charges at the vertical last stage are transferred to the horizontal transfer portion, the signal charges in every k (k=n/m; where m is a natural number) columns of each of the unit of n columns are transferred selectively from the vertical last stage to the horizontal transfer portion, the signal charges in the horizontal transfer portion are transferred in the horizontal direction by a predetermined number of columns, and then the signal charges in the other k columns of each of the unit of n columns are transferred selectively from the vertical last stage to the horizontal transfer portion, whereby the signal charges are added in the horizontal direction.

Further, it is preferable that the transfer electrodes at the vertical last stage, which is closest to the horizontal transfer portion, include further one phase of an independent transfer electrode that is independent of the vertical transfer stage, and the further one phase of the independent transfer electrode is constituted as a transfer electrode that is common to individual columns of the vertical last stages.

In the method for driving a solid-state imaging device according to the present invention with the above-described configuration, it is preferable that, in the (c) mixing, the signal charge at the signal transfer stage and the dummy signal at the following dummy transfer stage are mixed together by supplying a control signal to each of the independent transfer electrodes so that a side close to the horizontal transfer portion in all of the unit of n columns of the independent transfer electrodes is made to be in a barrier state against the horizontal transfer portion and a side far from the horizontal transfer portion is made to be in a storage state.

Additionally, it is preferable that, in the (d) transferring, the method includes (d1) selectively transferring the signal charges in every k (k=n/m; where m is a natural number) columns of each of the unit of n columns from the vertical last stage to the horizontal transfer portion, (d2) transferring the signal charges in the horizontal transfer portion in the horizontal direction by a predetermined number of columns, and (d3) selectively transferring the signal charges in the other k columns of each of the unit of n columns from the vertical last stage to the horizontal transfer portion, thereby adding the signal charges in the horizontal direction.

Hereinafter, a solid-state imaging device, an imaging apparatus using the same and a method for driving the same according to an embodiment of the present invention will be described, with reference to the accompanying drawings.

First, referring to FIG. 1, the schematic configuration of a solid-state imaging device according to the present embodiment will be described. This solid-state imaging device 1 includes a plurality of photoelectric conversion portions 2 that are arranged two-dimensionally so as to correspond to respective pixels, readout portions 3 for reading out signal charges respectively from the photoelectric conversion portions 2, vertical transfer portions 4 that are arranged so as to correspond to respective columns of the photoelectric conversion portions 2 for transferring the read out signal charges in a vertical direction, a horizontal transfer portion 5 for transferring the signal charges received from the vertical transfer portions 4 in a horizontal direction, and an output portion 6 for amplifying and outputting the signal charges from the horizontal transfer portion 5.

The vertical transfer portions 4 and the horizontal transfer portion 5 individually are constituted by CCDs (charge-coupled devices). Photodiodes are used as the photoelectric conversion portions 2. The respective photoelectric conversion portions 2 are provided with color filters of red (R), green (G) and blue (B) in a predetermined arrangement, thereby constituting a single-plate color solid-state imaging device. The color filters in the present embodiment are in a Bayer arrangement in which G (Gb) and B color filters alternate in one horizontal row and R and G (Gr) color filters alternate in its adjacent rows. Accordingly, in four pixels (two×two, vertically by horizontally) at the upper right corner of FIG. 1, for example, the color filters are arranged so that the lower left pixel is assigned to R, the lower right and upper left pixels to G and the upper right pixel to B.

The readout portions 3 are arranged between the photoelectric conversion portions 2 and the vertical transfer portion 4 and have a function of transferring the signal charges from the photoelectric conversion portions 2 selectively to the vertical transfer portion 4. Respective electrodes of the readout portions 3, the vertical transfer portions 4 and the horizontal transfer portion 5 are supplied with predetermined control signals from a control portion (not shown), whereby the operation of the solid-state imaging device 1 is controlled. Incidentally, electrodes for controlling the readout portions 3 also are supplied with control signals from the control portion, whereby the operation of reading out the signal charges from the photoelectric conversion portions 2 to the vertical transfer portion 4 is controlled. The electrodes for controlling the readout portions 3 also may serve as electrodes for transfer through the vertical transfer portion 4. The control portion is provided in an external part of the solid-state imaging device 1 and connected with the solid-state imaging device 1 via signal lines. Alternatively, the control portion may be provided as one piece with the solid-state imaging device 1.

The vertical transfer portion 4 is formed of a plurality of vertical transfer stages 4a, each of which corresponds to three rows of the photoelectric conversion portions 2 aligned in the vertical direction. With such a configuration, it becomes possible to read out signal charges in every other pixel with the same color to the vertical transfer portion 4 by each set of three rows, for example, by control voltages supplied to the electrodes for controlling the readout portions 3, and mix them together at the vertical last stage as described later.

The individual vertical transfer stages 4a in the vertical transfer portion 4 have electrodes with identical configurations except for a vertical last stage 4f, which is a vertical transfer stage closest to the horizontal transfer portion 5. In other words, these vertical transfer stages 4a have a plurality of common electrodes. On the other hand, the vertical last stage 4f has at least three independent transfer electrodes that are independent of the plurality of common electrodes of the other vertical transfer stages 4a. Also, the electrodes of the vertical last stages 4f have identical configurations repeated every three columns. Each of first to third columns forming a unit of three columns of the vertical last stages 4f is constituted so as to be able to transfer a signal charge independently of the other vertical transfer stages 4a in the same column and independently of the vertical last stages 4f in the other columns in the same unit of three columns. In other words, it is possible to transfer only the signal charge of the vertical last stage 4f in any one of the three columns to the horizontal transfer portion 5 while holding the signal charges in the vertical last stages 4f in the other two columns.

Figure 2:
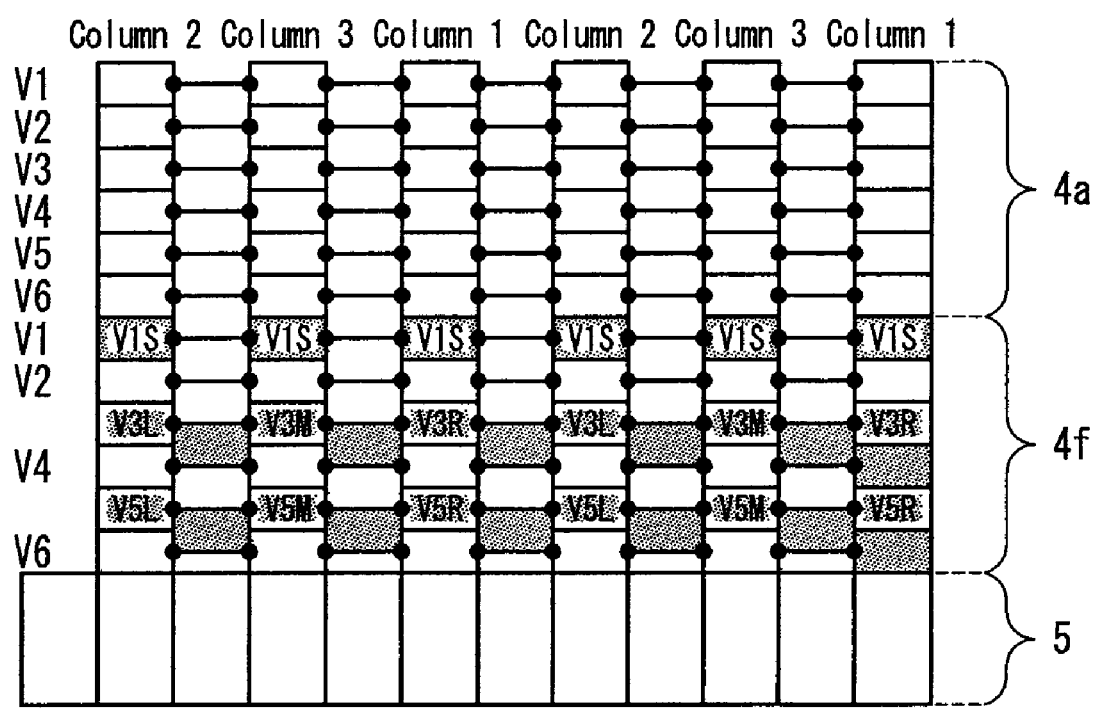
FIG. 2 shows an electrode configuration in the solid-state imaging device shown in FIG. 1.

FIG. 2 shows an electrode configuration in the solid-state imaging device in the present embodiment. In this electrode configuration, each of the vertical transfer stages 4a except for the vertical last stage 4f in the vertical transfer portion 4 shown in FIG. 1 is constituted by transfer electrodes (common electrodes) for six phases V1 to V6. In the vertical last stage 4f, electrodes in first, third and fifth phases have different configurations from the common electrodes in the other vertical transfer stages 4a so as to allow a transfer operation independent of the other vertical transfer stages 4a and allow a transfer operation independent of the vertical last stages 4f in the other columns in the unit of three columns.

In other words, a transfer electrode V1S in the first phase of the vertical last stage 4f serves as a transfer electrode that is independent of the other vertical transfer stages 4a and common to the individual columns of the vertical last stages 4f. Also, transfer electrodes V3R and V5R in the third and fifth phases in the first column in each of the vertical last stages 4f are independent of the transfer electrodes of the other vertical transfer stages 4a and independent of the transfer electrodes in the third and fifth phases in the second and third columns. Similarly, transfer electrodes V3L and V5L in the third and fifth phases in the second column in each of the vertical last stages 4f are independent of both the transfer electrodes of the other vertical transfer stages 4a and those in the first and third columns. Similarly, transfer electrodes V3M and V5M in the third and fifth phases in the third column in the vertical last stages 4f also are independent of both the transfer electrodes of the other vertical transfer stages 4a and those in the first and second columns.

Although not shown in the figure, the transfer electrodes of the horizontal transfer portion 5 are constituted by widely known two phases of transfer electrodes, as shown in JP 9(1997)-18792 A or JP 2004-180284 A.

Figure 3:
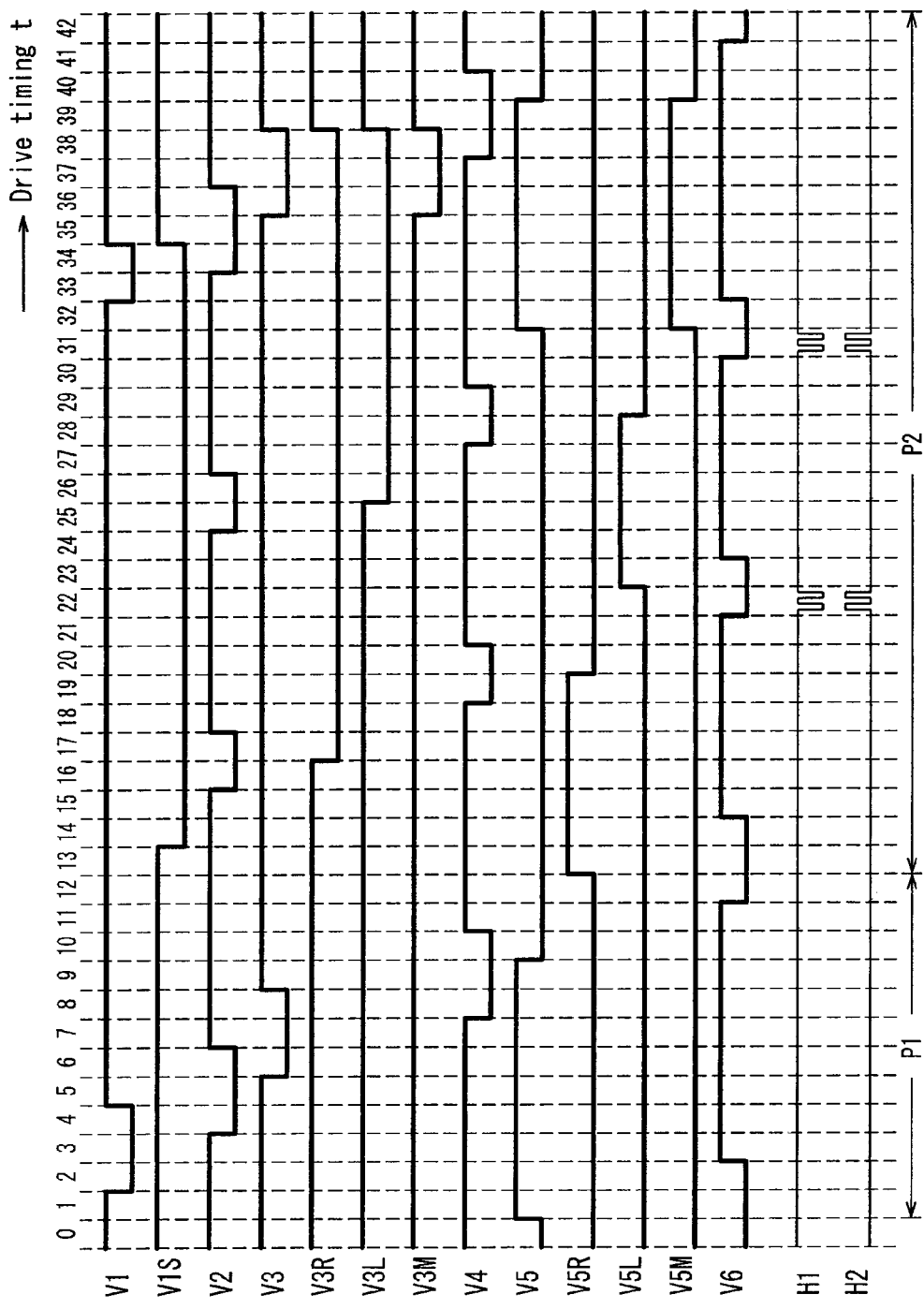
FIG. 3 is a timing chart showing control signals supplied from a control portion to respective transfer electrodes in vertical transfer portions and a horizontal transfer portion having the electrode configuration shown in FIG. 2.

FIG. 3 is a timing chart showing control signals (drive pulses) supplied from the control portion to the respective transfer electrodes in the vertical transfer portions 4 and the horizontal transfer portion 5 having the electrode configuration shown in FIG. 2. In the timing chart of FIG. 3, H1 and H2 indicate the control signals supplied respectively to two transfer electrodes constituting the horizontal transfer portion 5. V1 to V6 indicate the control signals supplied to the six common electrodes V1 to V6 constituting the vertical transfer portions 4. Further, V1S, V3R, V3L, V3M, V5R, V5L and V5M indicate the control signals supplied to the independent transfer electrodes of the vertical last stages 4f.

In the timing chart of FIG. 3, when each of the control signals (drive pulses) is at a high level, the transfer electrode to be supplied with this control signal is in a storage state. Also, when the control signal is at a low level, the transfer electrode to be supplied with this control signal is in a barrier state.

Figure 4:
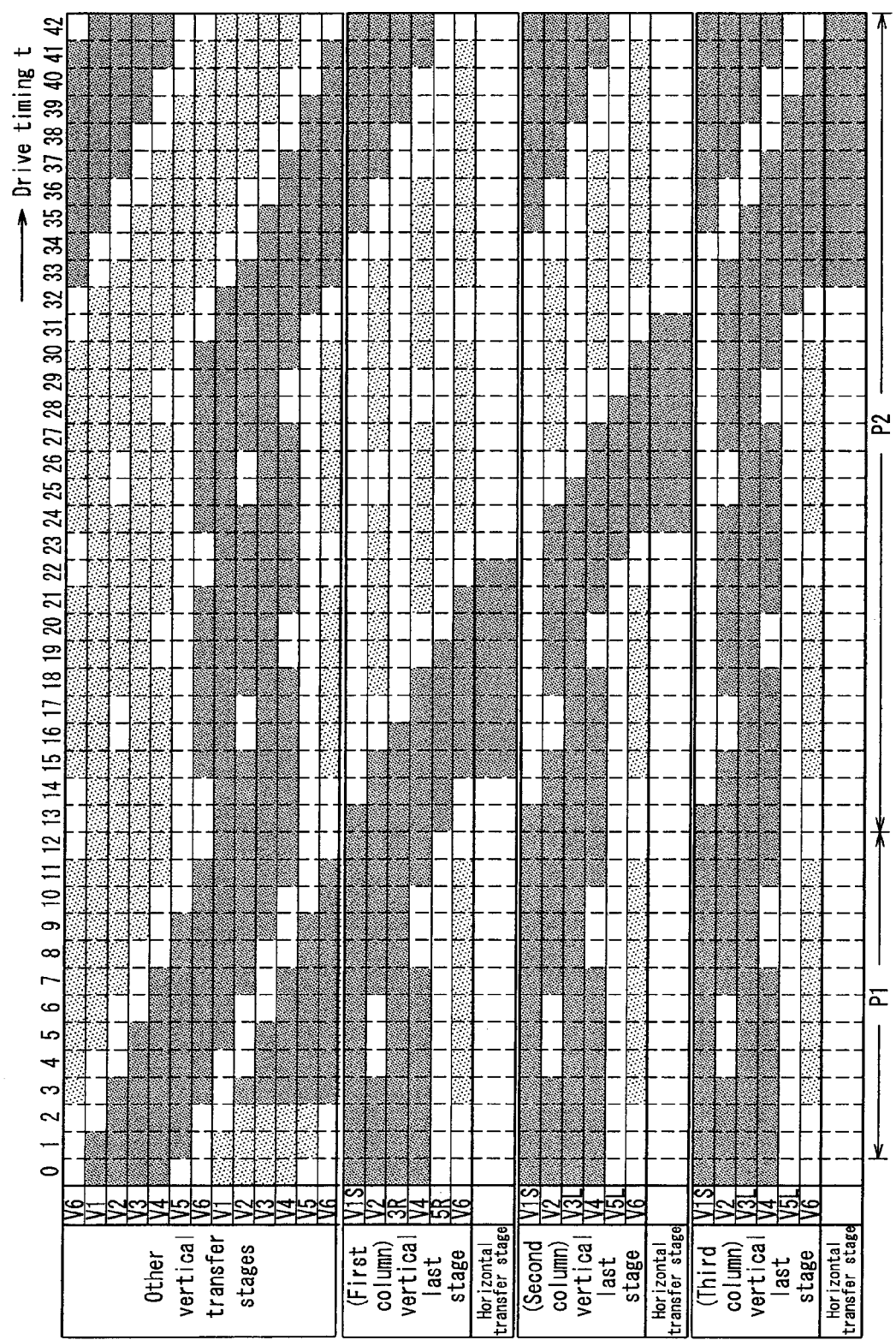
FIG. 4 schematically shows charge transfer corresponding to the timing chart shown in FIG. 3.

FIG. 4 schematically shows the charge transfer corresponding to the timing chart shown in FIG. 3. This figure shows a charge storage state at a position corresponding to each of the transfer electrodes in a charge transfer path on the same scale of time axis as the timing chart shown in FIG. 3. In other words, vertical positions of cells in a matrix correspond to the respective transfer electrodes, and horizontal positions thereof correspond to the respective drive timings on the time axis shown along the horizontal axis of the timing chart of FIG. 3.

Hatching in each cell indicates that the corresponding transfer electrode is in a storage state. The dark hatching indicates a storage state in which the read-out signal charge is being transferred. The light hatching indicates a storage state of a dummy signal in which the read-out signal charge is not being transferred.

In the driving of the vertical transfer portions 4 according to the timing chart of FIG. 3, a period P1 from drive timings t1 to t12 is a step for mixing signal charges corresponding to two rows of the vertical transfer stage in the vertical last stage 4f. At the drive timing t3, the signal charges corresponding to the adjacent two rows of the vertical transfer stage are mixed together. Herein, such mixing of the signal charges in the vertical direction will be referred to as vertical mixing. In the present embodiment, the transfer electrodes V1S, V3R, V3L and V3M of the vertical last stage 4f are held at a high level as a storage state for the vertical mixing, and the transfer electrodes V5R, V5L and V5M thereof are held at a low level as a barrier state against the horizontal transfer portion 5. In this way, since the stored charges in the vertical last stage 4f remain in the vertical last stage 4f without being transferred to the horizontal transfer portion 5, signals of the adjacent vertical transfer stage in the same column can be mixed together in the vertical last stage.

Also, in the present embodiment, at the time of reading out the signal charges, the readout portions 3 are driven so that signal transfer stages from which the signal charges are read out and dummy transfer stages from which the signal charges are not read out are formed alternately in each of the vertical transfer stages constituting each column of the vertical transfer portions 4. The state of the alternating signal transfer stages and dummy transfer stages is transferred toward the horizontal transfer portion 5. Then, the readout portions 3 and the individual transfer electrodes are set to be driven so that the storage states of the signal transfer stages and the following dummy transfer stages are mixed together in the vertical last stage 4f. By mixing together the storage states of the signal transfer stages and the following dummy transfer stages in the vertical last stage 4, it is possible to return and add signal charges that have leaked into the dummy transfer stages due to a transfer leakage during transfer through the vertical transfer stages to the signal transfer stages in the same column at the vertical last stage 4f, thus suppressing image quality deficiencies due to transfer degradation. It should be noted that, in order to achieve the effects described above, the transfer electrode V1S in the first phase does not need to have a configuration allowing an independent transfer operation.

Figure 5:
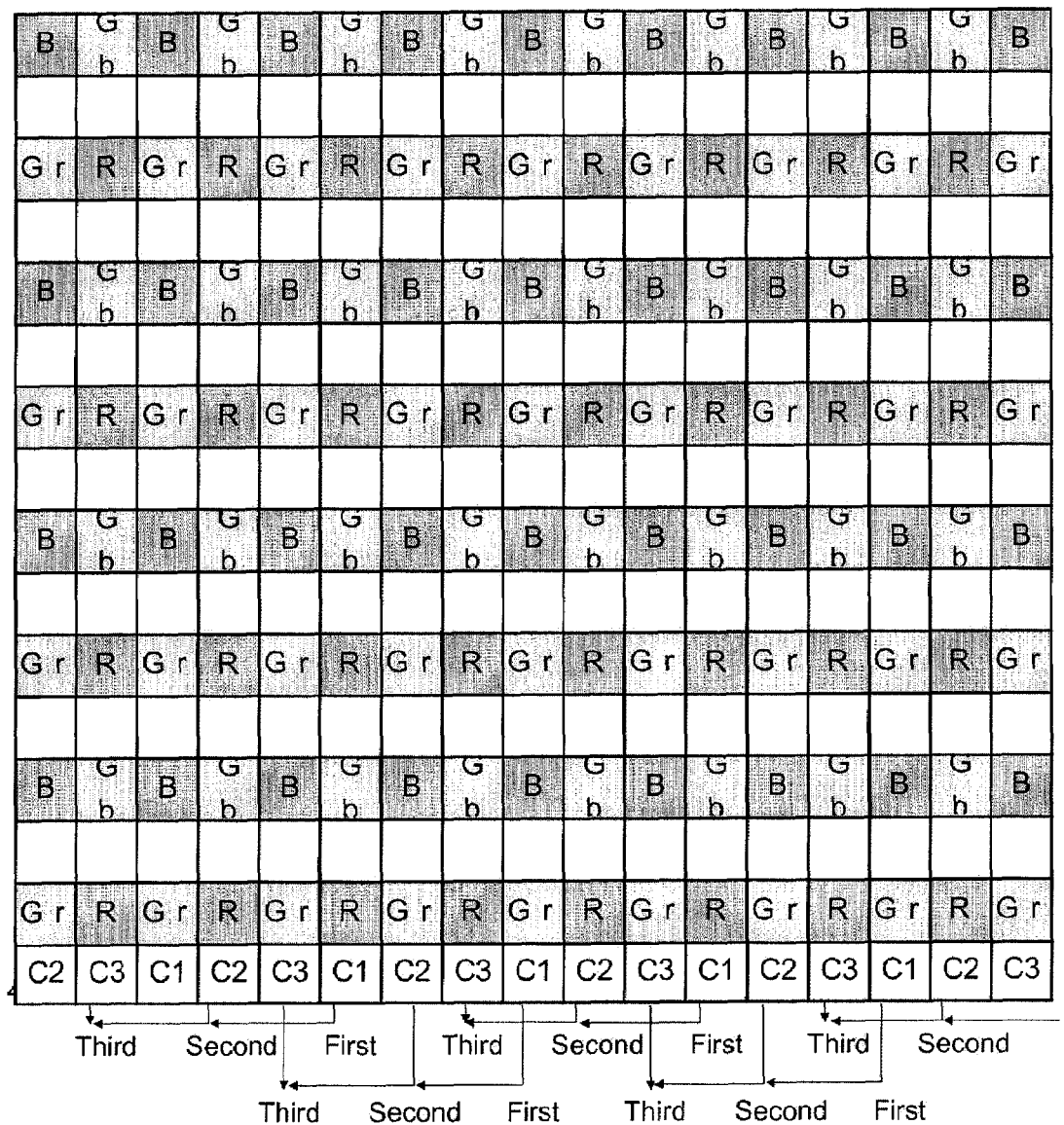
FIG. 5 is a drawing for showing partial pixel arrangement and describing combinations of pixel signals to be mixed in the horizontal transfer portion.

After the above-described vertical mixing, the operation shown in a period P2 of drive timings t13 to t42 is repeated within a horizontal blanking period, thereby mixing the signal charges of the same color in the horizontal transfer portion 5. This operation will be explained with reference to FIG. 5. FIG. 5 is a drawing for showing partial pixel arrangement and describing combinations of pixel signals to be mixed in the horizontal transfer portion. C1 to C3 at the vertical last stage 4f correspond to the first to third columns shown in FIGS. 1, 2 and 4.

In other words, as shown in FIGS. 3 and 4, first, the signal charge at the vertical last stage 4f in the first column (C1) is transferred independently to the horizontal transfer portion 5 (t13 to t21). Next, the signal charge in the first column that has been transferred to the horizontal transfer portion 5 is transferred horizontally by two pixels (t22) so as to be shifted to a horizontal transfer stage adjacent to the vertical last stage 4f in the second column (C2). Subsequently, the signal charge at the vertical last stage 4f in the second column is transferred independently to the horizontal transfer portion 5 (t23 to t30), thereby mixing together the signal charges at the vertical last stages 4f in the first and second columns. Then, the mixed signal charges are transferred horizontally by two pixels (t31) so as to be shifted to a horizontal transfer stage adjacent to the vertical last stage 4f in the third column (C3). Next, the signal charge at the vertical last stage 4f in the third column is transferred independently to the horizontal transfer portion 5 (t32 to t42), thereby mixing together the signal charges at the vertical last stages 4f in the first second and third columns. In this manner, the signal charges from the three pixels of the same color located at two pixels away from one another in the horizontal direction can be mixed together in the horizontal transfer portion 5.

Incidentally, in the solid-state imaging device according to the present embodiment, the vertical transfer portions 4 have the electrodes with identical configurations repeated every three columns, i.e., the electrode configurations forming a unit of three columns. However, the driving method according to the present invention is not limited to the application to the solid-state imaging devices in which the vertical transfer portions 4 are constituted to form a unit of three columns but those in which the electrodes with identical configurations are repeated every two or more columns, namely, in a unit of n (n is an integer equal to or larger than 2) columns. Further, in order to mix the signal charges in the horizontal transfer portion 5, the signal charges also can be transferred to the horizontal transfer portion 5 not by every column but by every plural columns, namely, by every k=n/m (m is a natural number) columns of each unit of n columns of the vertical transfer portions.

As described above, in accordance with the present embodiment, the signal charges transferred through the vertical transfer portion 4 in the same column and the signal charges at the adjacent dummy transfer stages that follow can be mixed together at the vertical last stage 4f. Accordingly, the leaking charges or the smear charges at the dummy transfer stages are mixed with the signal charges in the same vertical transfer portion 4, so that it is possible to suppress image quality deficiencies due to transfer degradation or avoid a phenomenon in which the smear edge becomes jagged when the dummy transfer stages are formed to reduce the number of pixels in the vertical direction. Further, since the signal charges in the same row in the unit of n columns at the vertical last stages can be mixed together in the horizontal transfer portion, it is possible to reduce the number of pixels in the vertical and horizontal directions at the same time.

Figure 6:
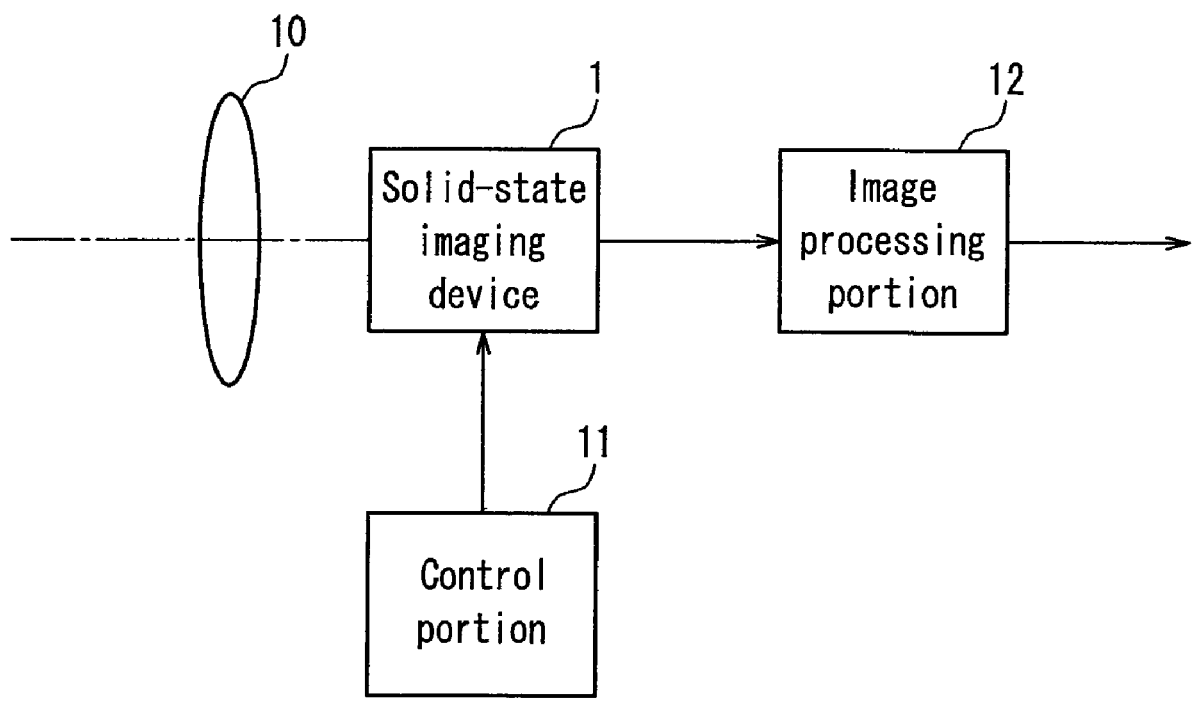
FIG. 6 is a block diagram showing a configuration of a solid-state imaging apparatus according to an embodiment of the present invention.
Figure 7:
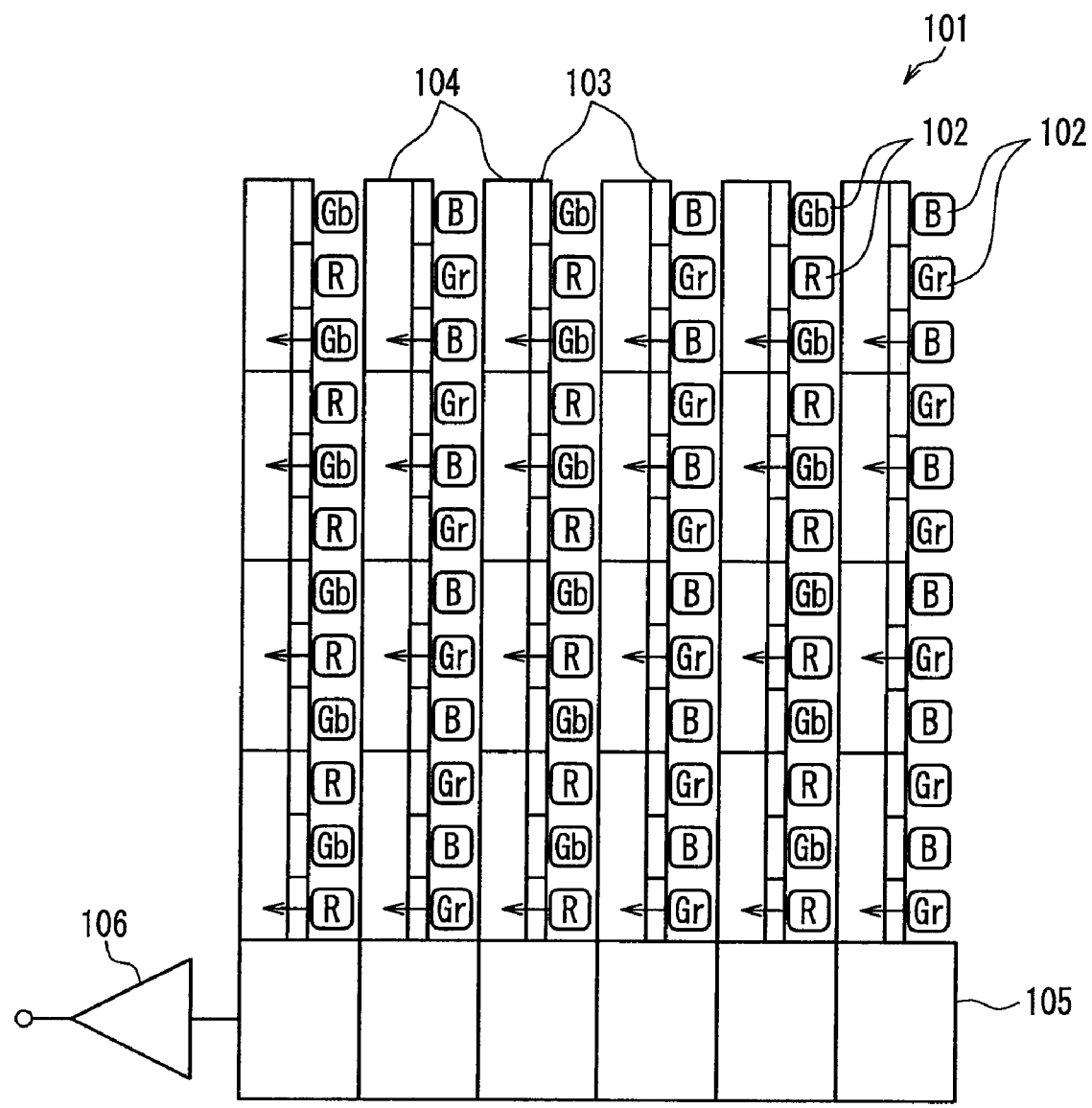
FIG. 7 shows a schematic configuration of a solid-state imaging device in a conventional example.

Using the solid-state imaging device 1 with the above-described configuration, it is possible to provide a solid-state imaging apparatus as shown in FIG. 6, for example. In other words, an optical system 10 including a lens, etc. is disposed so that incident light from a subject forms an image on an imaging plane of the solid-state imaging device 1. The incident light is detected by the photoelectric conversion portions 2 in the solid-state imaging device 1, and the driving of the solid-state imaging device 1 is controlled with predetermined control signals supplied from a control portion 11, so that image signals are outputted. The signals outputted from the solid-state imaging device 1 are subjected to various signal processings in an image processing portion 12 and then outputted as image signals.

Incidentally, in the case of mixing signal charges from the successive pixels in the horizontal direction without providing any color filters in the solid-state imaging device, a dichroic mirror or the like can be used, thereby forming the above-described solid-state imaging apparatus as a color solid-state imaging apparatus (a so-called three-plate color camera). Furthermore, in the case of the three-plate color camera, it is preferable that operation modes are selectively switchable between at least two modes, namely, a first mode of not mixing signal charges from the pixels and a second mode of mixing signal charges from a plurality of adjacent pixels in the vertical direction and a plurality of adjacent pixels in the horizontal direction.

Although the embodiment of the present invention has been described above, the present invention is not limited to the above embodiment but can be practiced in various forms. For example, the present invention is applicable to not only the solid-state imaging device having the color filters in the Bayer arrangement shown in FIG. 1 but also a solid-state imaging device having color filters in other arrangements.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging apparatus comprising:
   a plurality of photoelectric conversion portions that are arranged two-dimensionally in a matrix form;
   a readout portion for reading out selectively a signal charge from each of the photoelectric conversion portions;
   a plurality of vertical transfer portions, provided so as to correspond to respective columns of the photoelectric conversion portions, for transferring the signal charge read out by the readout portion in a vertical direction;
   a horizontal transfer portion for transferring the signal charge received from the plurality of vertical transfer portions in a horizontal direction; and
   a control portion for supplying a drive signal to each of transfer electrodes constituting the readout portion, the vertical transfer portions and the horizontal transfer portion and controlling the read out of the signal charge by the readout portion and the transfer of the signal charge;
   wherein each of the plurality of vertical transfer portions comprises a plurality of vertical transfer stages, each provided with a plurality of phases of the transfer electrodes, the transfer electrodes at a vertical last stage, which is closest to the horizontal transfer portion among the vertical transfer stages, include independent transfer electrodes for at least two phases, that are independent of the other vertical transfer stages, the independent transfer electrodes have identical configurations repeated in a unit of n (n is an integer equal to or larger than 2) columns and are constituted so as to be in common among corresponding columns in a plurality of the units of n columns and independent of the independent transfer electrodes belonging to the other columns in the unit of n columns, at a time of reading out the signal charge, the readout portion is driven so that a signal transfer stage from which the signal charge is read out and a dummy transfer stage from which the signal charge is not read out are formed alternately in the plurality of vertical transfer stages constituting each column of the vertical transfer portions, the signal charge and a dummy signal at the signal transfer stage and the dummy transfer stage that are arranged alternately are transferred toward the horizontal transfer portion, and the signal charge at the signal transfer stage and the dummy signal at the following dummy transfer stage are mixed together at the vertical last stage, and the transfer electrodes are driven so that the mixed signal charges at the vertical last stage are transferred to the horizontal transfer portion.

2. The solid-state imaging apparatus according to claim 1, wherein the signal charge at the signal transfer stage and the dummy signal at the following dummy transfer stage are mixed together by supplying a control signal to each of the independent transfer electrodes so that the independent transfer electrodes positioned on a side close to the horizontal transfer portion in all of the unit of n columns of the independent transfer electrodes are made to be in a barrier state against the horizontal transfer portion and those positioned on a side far from the horizontal transfer portion are made to be in a storage state.

3. The solid-state imaging apparatus according to claim 1, wherein when the mixed signal charges at the vertical last stage are transferred to the horizontal transfer portion, the transfer electrodes are driven so that the signal charges in every k (k=n/m; where m is a natural number) columns of each of the unit of n columns are transferred selectively from the vertical last stage to the horizontal transfer portion, the signal charges in the horizontal transfer portion are transferred in the horizontal direction by a predetermined number of columns, and then the signal charges in the other k columns of each of the unit of n columns are transferred selectively from the vertical last stage to the horizontal transfer portion, whereby the signal charges are added in the horizontal direction.

4. The solid-state imaging apparatus according to claim 1, wherein the transfer electrodes at the vertical last stage, which is closest to the horizontal transfer portion, include further one phase of an independent transfer electrode that is independent of the vertical transfer stages, and the further one phase of the independent transfer electrode is constituted as a transfer electrode that is common to individual columns of the vertical last stages.

5. A method for driving a solid-state imaging device comprising
a plurality of photoelectric conversion portions that are arranged two-dimensionally in a matrix form,
a readout portion for reading out selectively a signal charge from each of the photoelectric conversion portions,
a plurality of vertical transfer portions, provided so as to correspond to respective columns of the photoelectric conversion portions, for transferring the signal charge read out by the readout portion in a vertical direction, and
a horizontal transfer portion for transferring the signal charge received from the plurality of vertical transfer portions in a horizontal direction,
wherein each of the plurality of vertical transfer portions comprises a plurality of vertical transfer stages, each provided with a plurality of phases of transfer electrodes,
the transfer electrodes at a vertical last stage, which is closest to the horizontal transfer portion among the vertical transfer stages, include independent transfer electrodes for at least two phases, that are independent of the other vertical transfer stages, and
the independent transfer electrodes have identical configurations repeated in a unit of n (n is an integer equal to or larger than 2) columns and are constituted so as to be in common among corresponding columns in a plurality of the units of n columns and independent of the independent transfer electrodes belonging to the other columns in the unit of n columns, the method comprising:
(a) at a time of reading out the signal charge, supplying a control signal to the readout portion so that a signal transfer stage from which the signal charge is read out and a dummy transfer stage from which the signal charge is not read out are formed alternately in each of the vertical transfer stages constituting each column of the vertical transfer portions;
(b) transferring the signal charge and a dummy signal at the signal transfer stage and the dummy transfer stage that are arranged alternately toward the horizontal transfer portion;
(c) mixing together the signal charge at the signal transfer stage and the dummy signal at the following dummy transfer stage at the vertical last stage; and
(d) transferring the mixed signal charges at the vertical last stage to the horizontal transfer portion.

6. The method according to claim 5, wherein in the (c) mixing, the signal charge at the signal transfer stage and the dummy signal at the following dummy transfer stage are mixed together by supplying a control signal to each of the independent transfer electrodes so that the independent transfer electrodes positioned on a side close to the horizontal transfer portion in all of the unit of n columns of the independent transfer electrodes are made to be in a barrier state against the horizontal transfer portion and those positioned on a side far from the horizontal transfer portion are made to be in a storage state.

7. The method according to claim 5, wherein in the (d) transferring, the method comprises
(d1) selectively transferring the signal charges in every k (k=n/m; where m is a natural number) columns of each of the unit of n columns from the vertical last stage to the horizontal transfer portion,
(d2) transferring the signal charges in the horizontal transfer portion in the horizontal direction by a predetermined number of columns, and
(d3) selectively transferring the signal charges in the other k columns of each of the unit of n columns from the vertical last stage to the horizontal transfer portion, thereby adding the signal charges in the horizontal direction.

* * * * *